United States Patent
Kwon et al.

(10) Patent No.: US 10,388,399 B2
(45) Date of Patent: Aug. 20, 2019

(54) MEMORY DEVICE, MEMORY SYSTEM, AND OPERATING METHOD OF MEMORY DEVICE

(71) Applicant: Samsung Electronics Co., Ltd., Suwon-si, Gyeonggi-do (KR)

(72) Inventors: Hye-jung Kwon, Seoul (KR); Kwang-il Park, Yongin-si (KR); Seung-jun Bae, Hwaseong-si (KR); Eun-sung Seo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/850,152

(22) Filed: Dec. 21, 2017

(65) Prior Publication Data

US 2018/0358109 A1    Dec. 13, 2018

(30) Foreign Application Priority Data

Jun. 13, 2017    (KR) .................. 10-2017-0074015

(51) Int. Cl.
*G11C 29/50*    (2006.01)
*G11C 5/14*    (2006.01)
(Continued)

(52) U.S. Cl.
CPC .............. *G11C 29/50* (2013.01); *G11C 5/145* (2013.01); *G11C 5/147* (2013.01);
(Continued)

(58) Field of Classification Search
CPC ................... G11C 29/50; G11C 5/145
(Continued)

(56) References Cited

U.S. PATENT DOCUMENTS

| 5,310,466 A | * | 5/1994 | La Riviere | ................ | C25C 7/06 204/229.2 |
| 7,353,123 B2 | | 4/2008 | Takakamo et al. | | |

(Continued)

FOREIGN PATENT DOCUMENTS

| CN | 101430935 A | 5/2009 |
| JP | 2002171686 A | 6/2002 |

(Continued)

OTHER PUBLICATIONS

Search Report and Written Opinion dated Oct. 30, 2018 issued in corresponding Singaporean Application No. 10201803718T.

*Primary Examiner* — Hoai V Ho
*Assistant Examiner* — Muna A Techane
(74) *Attorney, Agent, or Firm* — Harness, Dickey & Pierce, P.L.C.

(57) ABSTRACT

Memory devices and methods of operating the same are provided. The memory device including at least one internal circuit including a memory cell array and a peripheral circuit configured to drive the memory cell array, a monitor logic configured to monitor a current flowing into the at least one internal circuit and output a monitoring result, a detect logic configured to detect whether a leakage current flows in the at least one internal circuit based on the monitoring result, and output detected information regarding the leakage current, and diagnosis logic configured to diagnose an error in the at least one internal circuit based on the detected information.

20 Claims, 15 Drawing Sheets

(51) Int. Cl.
　　　*G11C 29/02*　　(2006.01)
　　　*G11C 29/04*　　(2006.01)
　　　*G11C 29/12*　　(2006.01)
　　　*G11C 29/52*　　(2006.01)
　　　*G11C 11/4074*　(2006.01)
　　　*G11C 7/10*　　(2006.01)

(52) U.S. Cl.
　　　CPC .......... *G11C 11/4074* (2013.01); *G11C 29/02* (2013.01); *G11C 29/04* (2013.01); *G11C 29/12005* (2013.01); *G11C 29/50004* (2013.01); *G11C 29/50012* (2013.01); *G11C 29/52* (2013.01); *G11C 7/1063* (2013.01); *G11C 2029/0409* (2013.01); *G11C 2029/5004* (2013.01); *G11C 2029/5006* (2013.01)

(58) Field of Classification Search
　　　USPC ........................................................ 365/201
　　　See application file for complete search history.

(56) References Cited

U.S. PATENT DOCUMENTS

| | | | |
|---|---|---|---|
| 8,385,134 B2 | 2/2013 | Yamaki | |
| 8,693,254 B2* | 4/2014 | Hashimoto | G11C 16/0483 365/185.17 |
| 8,860,817 B2 | 10/2014 | Solhusvik et al. | |
| 8,904,215 B2 | 12/2014 | Ryoo | |
| 9,123,430 B2 | 9/2015 | Cernea | |
| 9,159,452 B2* | 10/2015 | Yamada | G11C 29/02 |
| 9,308,826 B2 | 4/2016 | Garcia-Flores | |
| 9,443,610 B1 | 9/2016 | Pan et al. | |
| 9,460,786 B2 | 10/2016 | Kang | |
| 9,711,227 B1* | 7/2017 | Ghai | G06F 3/0619 |
| 2005/0002258 A1* | 1/2005 | Iwase | B82Y 10/00 365/222 |
| 2008/0219061 A1 | 9/2008 | Choi et al. | |
| 2009/0097328 A1 | 4/2009 | Kim | |
| 2013/0027566 A1 | 1/2013 | Solhusvik et al. | |
| 2013/0194868 A1 | 8/2013 | Hashimoto | |
| 2014/0022002 A1 | 1/2014 | Chua-Eoan et al. | |
| 2015/0071000 A1 | 3/2015 | Namai et al. | |
| 2015/0255162 A1 | 9/2015 | Shibazaki et al. | |
| 2016/0018453 A1 | 1/2016 | Jeon et al. | |
| 2016/0018454 A1 | 1/2016 | Jeon et al. | |
| 2016/0066280 A1 | 3/2016 | Heo et al. | |
| 2016/0105089 A1* | 4/2016 | Shi | H02K 33/18 310/25 |
| 2016/0182058 A1* | 6/2016 | Stirk | G01R 31/3675 327/145 |
| 2016/0351247 A1* | 12/2016 | Vyavahare | G11C 11/4093 |
| 2016/0351274 A1* | 12/2016 | Pan | G11C 29/025 |

FOREIGN PATENT DOCUMENTS

| | | |
|---|---|---|
| KR | 10-0672142 A | 1/2007 |
| KR | 10-2016-0025145 A | 3/2016 |

* cited by examiner

MEMORY DEVICE, MEMORY SYSTEM, AND OPERATING METHOD OF MEMORY DEVICE

CROSS-REFERENCE TO RELATED APPLICATION

This application claims priority under 35 U.S.C. § 119 to Korean Patent Application No. 10-2017-0074015, filed on Jun. 13, 2017, in the Korean Intellectual Property Office, the disclosure of which is incorporated herein in its entirety by reference.

BACKGROUND

The inventive concepts relate to memory devices, and more particularly, to memory devices, memory systems including the same, and/or methods of operating the memory devices, which are configured to diagnose an error by detecting a leakage current.

Semiconductor memory devices, such as dynamic random-access memory (DRAM) devices, are widely used as the main memories of electronic systems including computers and portable electronic devices. In an active mode, a memory device inevitably consumes power for performing various memory operations (e.g., a write operation, a read operation, an erase operation, and/or a refresh operation). In an idle state other than the active mode, the memory device operates in a standby mode to minimize power consumption. However, the magnitude of a leakage current in the standby state tends to gradually increase due to miniaturization of the memory devices. A memory device is widely used in the field of Internet of Things (IoT). Thus, the leakage current problem in the standby state is becoming more significant.

SUMMARY

The inventive concepts provide memory devices, memory systems including the same, and methods of operating the memory devices, and more particularly, memory devices, memory systems including the same, and methods of operating the memory devices, which are configured to diagnose an error by detecting a leakage current.

According to an example embodiment of the inventive concepts, a memory device may include at least one internal circuit including a memory cell array and a peripheral circuit configured to drive the memory cell array, a monitor logic configured to monitor a current flowing into the at least one internal circuit and output a monitoring result, a detect logic configured to detect whether a leakage current flows in the at least one internal circuit, based on the monitoring result, and output detected information regarding the leakage current, and a diagnosis logic configured to diagnose an error in the at least one internal circuit based on the detected information.

According to an example embodiment of the inventive concepts, a memory device may include a power supply, at least one internal circuit configured to receive a voltage from the power supply, and an error detect circuit configured to detect a leakage current flowing into the internal circuit in a standby mode and detect an error regarding the at least one internal circuit based on information regarding the leakage current.

According to an example embodiment of the inventive concepts, a method of operating a memory device may include monitoring a current flowing into at least one internal circuit configured to drive a memory cell of the memory device and outputting a monitoring result, in a standby mode, detecting information regarding a leakage current flowing in the at least one internal circuit based on the monitoring result, diagnosing whether an error has occurred in the at least one internal circuit based on the information regarding the leakage current, and in response to a result of the diagnosing indicating that an error has occurred in the at least one internal circuit, outputting an error warning signal to an external device outside the memory device.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
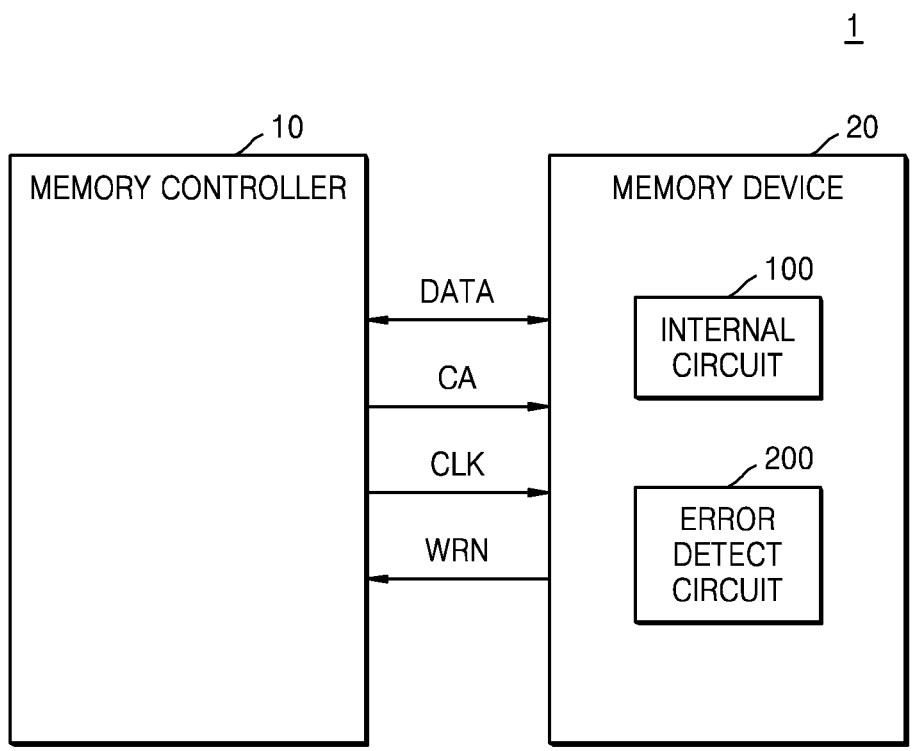
FIG. 1 is a diagram showing a memory system including a memory device, according to an example embodiment.

FIG. 1 is a diagram showing a memory system including a memory device, according to an example embodiment.

Referring to FIG. 1, a memory system 1 may include a memory controller 10 and a memory device 20. The memory device 20 may include an internal circuit 100 and an error detect circuit 200.

The internal circuit 100 may include, for example, a memory cell array and a peripheral circuit for driving the memory cell array. The peripheral circuit may include, for example, a command-address buffer, a control logic, a data I/O circuit, a command controller, a row decoder, a row driver, a column decoder, a column driver, a write driver, or a sense amplifier. When the memory cell array included in the internal circuit 100 includes volatile memory cells, the memory system 1 may be referred to as a volatile memory system.

In a standby mode, the error detect circuit 200 may detect a leakage current flowing into the internal circuit 100 and detect an error of the internal circuit 100 based on detected information regarding the leakage current. According to an example embodiment, the error detect circuit 200 may output an error warning signal WRN to the memory controller 10 when an error of the internal circuit 100 is detected.

The memory controller 10 may support reading memory transaction and/or writing memory transaction with respect to the memory device 20. The memory controller 10 may access the memory device 20, for example, in response to a memory transaction of a host.

A command-address CA, data DATA, and a clock signal CLK of the memory controller 10 may be transmitted to the memory device 20 through a bus. The bus may include, for example, a command-address line, a data I/O line, and a clock line. The command-address line may be a line configured to implement a command line and an address line as a single line and transmit a command and an address in a time sequence. According to another example embodiment, a command line and an address line may be implemented as separate lines.

The data DATA output from the memory device 20 in response to the command-address CA of the memory controller 10 may be transmitted to the memory controller 10 through the bus. According to an example embodiment, in the standby mode, the memory device 20 may measure the magnitude of a leakage current regarding at least one internal circuit 100 and, when the leakage current is equal to or greater than a critical (or threshold) value, may transmit the error warning signal WRN to the memory controller 10. In the standby mode, the memory device 20 may be in an idle state. The error warning signal WRN may be, for example, a request signal for the memory controller 10. In response to the error warning signal WRN, the memory controller 10 may take various measures to reduce the leakage current of the memory device 20.

For example, the memory controller 10 may be implemented as a separate chip from a processor. The memory controller 10 may perform memory transactions through other chipsets constituting the memory system 1 other than the processor. For example, when the memory system 1 may be configured as a computing device, the chipsets may include one or more integrated circuit (IC) packages or chips for connecting components (e.g., basic input/output system (BIOS) firmware, keyboards, mice, storage devices, and/or network interfaces) to the processor. According to some example embodiments, the memory controller 10 may be included in an application processor (AP).

The memory device 20 may include various memory devices that provide addressable storage locations which the memory controller 10 may read data from and/or write data to. The memory device 20 may be implemented as, for example, dynamic random-access memory (DRAM) devices, synchronous DRAM (SDRAM) devices, double data rate (DDR) SDRAM devices, or other memory devices.

Figure 2:
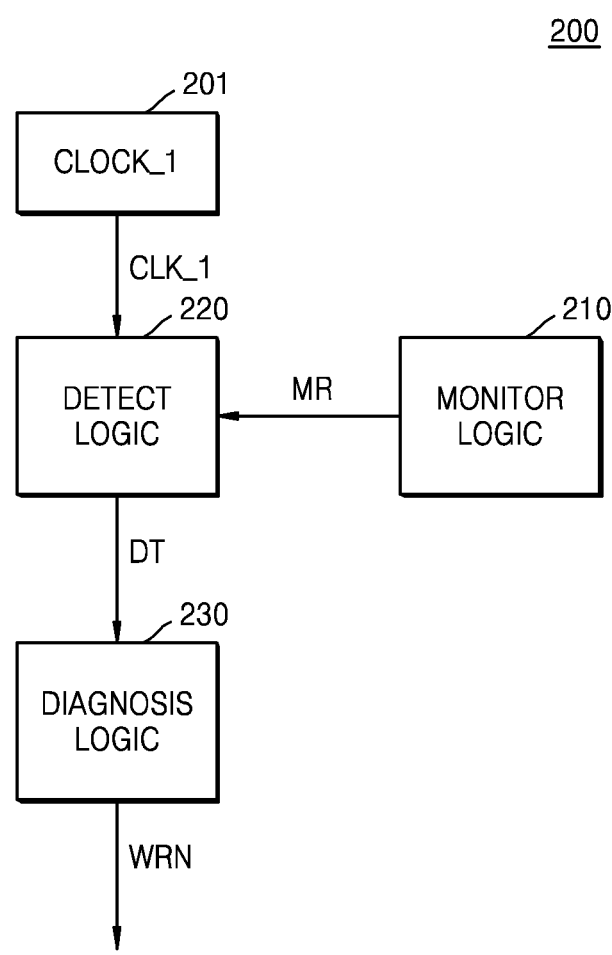
FIG. 2 is a block diagram of functional components of an error detect circuit, according to an example embodiment.

FIG. 2 is a block diagram of functional components of an error detect circuit, according to an example embodiment. FIG. 2 may be an example block diagram of the error detect circuit 200 shown in FIG. 1.

Referring to FIG. 2, the error detect circuit 200 may include a first clock generator 201, a monitor logic 210, a detect logic 220, and a diagnosis logic 230. According to an example embodiment, the first clock generator 201 may output a first clock signal CLK_1 to the detect logic 220. For example, the first clock generator 201 may output the first clock signal CLK_1 based on a clock signal CLK input by the memory controller 10 (FIG. 1). According to another example embodiment, the first clock generator 201 may output a first clock signal CLK_1 based on a clock signal generated within the memory device 20 (FIG. 1).

The monitor logic 210 may monitor a current flowing into the internal circuit 100 (FIG. 1) and output a monitoring result. The monitor logic 210 may, for example, monitor a current flowing into the internal circuit 100 (FIG. 1) in the standby mode.

The monitor logic 210 may monitor a current flowing into the internal circuit 100 (FIG. 1) in the standby mode and output a monitoring result MR to the detect logic 220. According to an example embodiment, the monitor logic 210 may include a voltage meter for sensing a voltage based on a current flowing into the internal circuit 100 (FIG. 1) in the standby mode, and an analog-to-digital converter for performing analog-to-digital conversion with respect to the voltage sensed by the voltage meter. According to some example embodiments, the monitor logic 210 may include a counter that counts a period of an internal clock signal having a varying period.

The detect logic 220 may detect whether a leakage current flows in the internal circuit 100 (FIG. 1) based on the monitoring result MR output from the monitor logic 210 and output detected information DT regarding the leakage current. According to an example embodiment, the detect logic 220 may detect whether a leakage current flows in the internal circuit 100 (FIG. 1) based on the monitoring result MR and the first clock signal CLK_1, and output detected information DT regarding the leakage current to the diagnosis logic 230. The detect logic 220 may be activated based on the first clock signal CLK_1.

For example, when the detect logic 220 is activated at a rising edge of the first clock signal CLK_1, the detect logic 220 may detect information regarding a leakage current flowing in the internal circuit 100 (FIG. 1) based on a monitoring result MR received at the rising edge. In another example, when the detect logic 220 is activated at a falling edge of the first clock signal CLK_1, the detect logic 220 may detect information regarding a leakage current flowing in the internal circuit 100 (FIG. 1) based on a monitoring result MR received at the falling edge. The detected information DT may, for example, include information regarding whether a leakage current is detected and information regarding the magnitude of the leakage current.

The diagnosis logic 230 may diagnose the internal circuit 100 (FIG. 1) for occurrence of an error based on the detected information DT output from the detect logic 220. Furthermore, the diagnosis logic 230 may output an error warning signal WRN based on the detected information DT. For example, when the diagnosis logic 230 diagnoses that an error has occurred in the internal circuit 100 (FIG. 1) based on the detected information DT, the diagnosis logic 230 may output an error warning signal WRN to a device outside the memory device 20 (FIG. 1). The device outside the memory device 20 (FIG. 1) may be, for example, the memory controller 10 (FIG. 1) or a host. According to an example embodiment, the diagnosis logic 230 may diagnose that there is an error in the memory device 20 (FIG. 1) when the magnitude of the leakage current detected by the detect logic 220 is equal to or greater than a desired (or alternatively, pre-set) first critical (or threshold) value.

The memory device according to an example embodiment may reduce a leakage current by detecting the leakage current flowing in the memory device, diagnosing whether an error has occurred based on the leakage current, and outputting an error warning signal to an external device. As a result, power efficiency of the memory device may be improved. Furthermore, when the memory device is applied to Internet of Things (IoT), various problems caused by a leakage current may be improved by the memory device itself.

Figure 3:
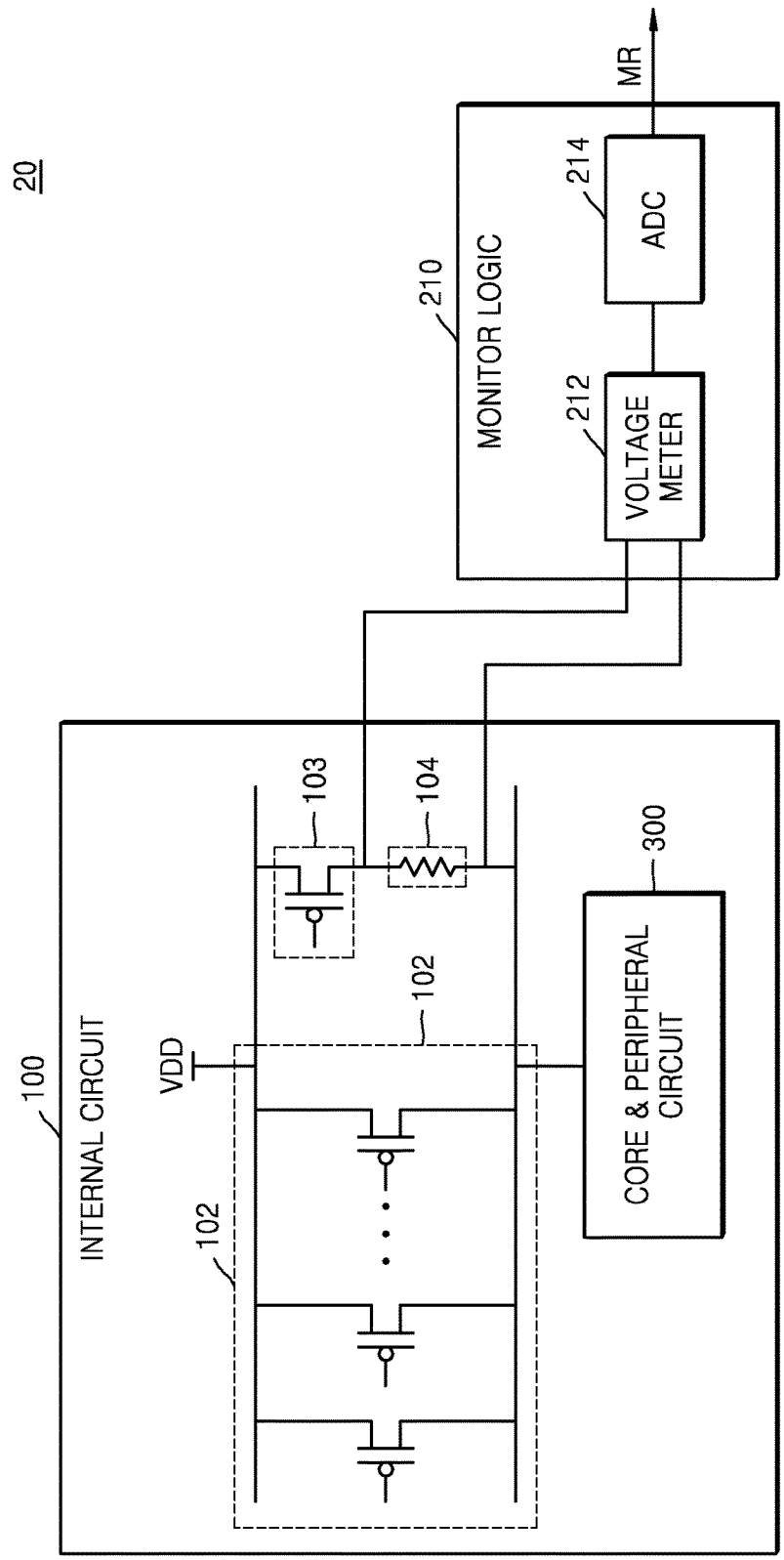
FIG. 3 is a diagram for describing an operation of a monitor logic, according to an example embodiment.

FIG. 3 is a diagram for describing an operation of a monitor logic, according to an example embodiment.

Referring to FIG. 3, the internal circuit 100 may include first switches 102, a second switch 103, a resistive element 104, and a core/peripheral circuit 300. The core/peripheral circuit 300 may include a memory cell array, a command-address buffer, control logic, a data I/O circuit, a command controller, a row decoder, a row driver, a column decoder, a column driver, a write driver, or a sense amp, for example.

A plurality of first switches 102 may be connected between a power voltage VDD and the core/peripheral circuit 300. For example, a first end of each of the first switches 102 may be connected to the power voltage VDD, whereas a second end of each of the first switches 102 may be connected to the core/peripheral circuit 300. According to an example embodiment, the first switches 102 may be turned on in the active mode of the memory device 20 and may be turned off in the standby mode. In the active mode, the memory device 20 may perform general memory operations, such as a write operation, a read operation, an erase operation, or a refresh operation.

According to an example embodiment, the second switch 103 and a resistive element 104 may be connected between the power voltage VDD and the core/peripheral circuit 300. For example, a first end of the second switch 103 may be connected to the power voltage VDD, and a second end of the second switch 103 may be connected to the resistive element 104. Furthermore, a first end of the resistive element 104 may be connected to the second switch 103, and a second end of the resistive element 104 may be connected to the core/peripheral circuit 300.

According to an example embodiment, the second switch 103 may be turned on in the standby mode of the memory device 20 and turned off in the active mode. In other words, the second switch 103 and the resistive element 104 may constitute a path for a current flowing between the power voltage VDD and the core/peripheral circuit 300 in the standby mode. In some example embodiments, when the power voltage VDD is provided by a power supply (not shown), the second switch 103 and the resistive element 104 may constitute a path for a current flowing between the power supply (not shown) and the internal circuit 100 in the standby mode. According to the present example embodiment, the first switches 102 and the second switches 103 are implemented as P-type metal oxide semiconductors (PMOSs), however the inventive concepts are not limited thereto.

The monitor logic 210 may include a voltage meter 212 and an analog-to-digital converter 214. The voltage meter 212 may measure a voltage applied to the resistive element 104 and output a result of the measurement. The voltage meter 212 may be connected in parallel with the resistive element 104. The voltage applied to the resistive element 104 may result, for example, based on a current flowing into the core/peripheral circuit 300 in the standby mode.

The analog-to-digital converter 214 may convert voltage information output from the voltage meter 212 into a digital code. According to an example embodiment, the analog-to-digital converter 214 may convert analog voltage information output from the voltage meter 212 into a digital code and output the digital code as a monitoring result MR.

Figure 4A:
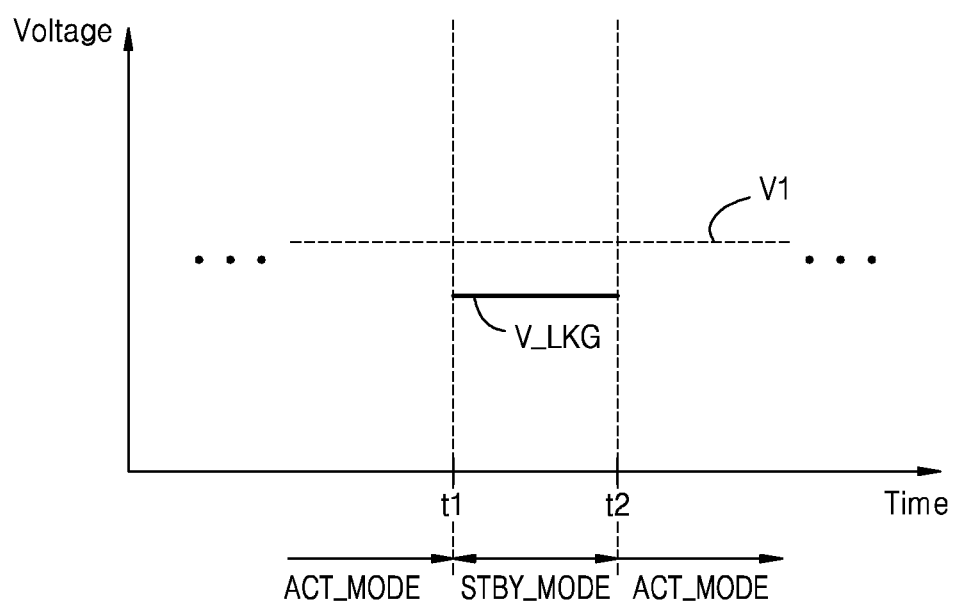
FIGS. 4A and 4B are graphs for describing an operation of a memory device, according to an example embodiment.
Figure 4B:
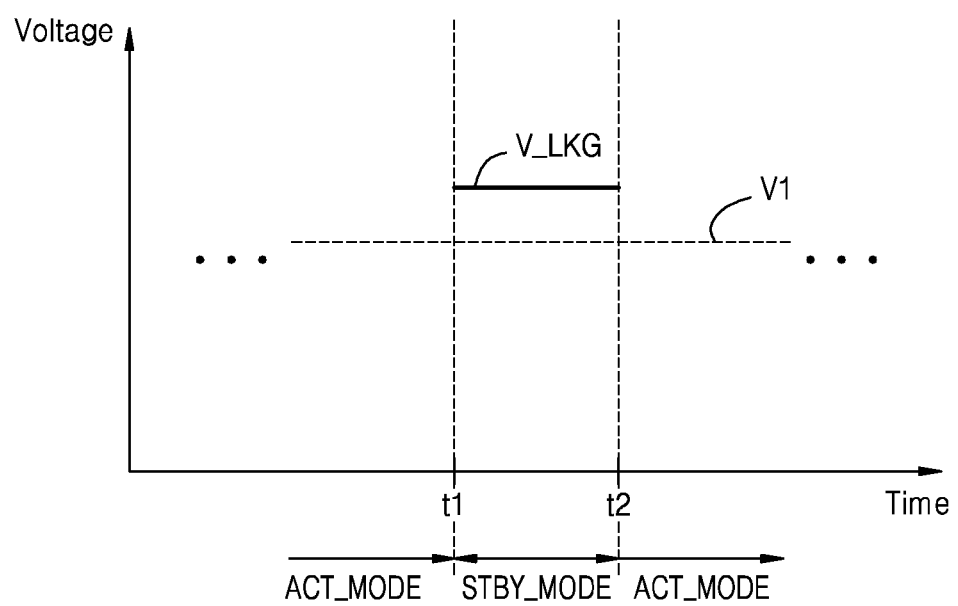

FIGS. 4A and 4B are graphs for describing an operation of a memory device, according to an example embodiment. FIGS. 4A and 4B may be graphs relating to an operation of the memory device 20 shown in FIGS. 1 and 2, for example.

Referring to FIGS. 4A and 4B, the memory device 20 may operate in a standby mode STBY_MODE between a first time point t1 and a second time point t2. In the standby mode STBY_MODE, the memory device 20 may be idle. The memory device 20 may operate in an active mode ACT_MODE before the first time point t1 and after the second time point t2.

In the standby mode STBY_MODE, whether a leakage current flows in the internal circuit 100 is detected based on a monitoring result MR output from the monitor logic 210, and an error of the internal circuit 100 may be diagnosed for based on detected information DT regarding the leakage current. The monitoring result MR may be converted into a digital code and be outputted, for example.

The detect logic 220 that has received the monitoring result MR may determine whether the leakage current flows, and an error of the internal circuit 100 may be diagnosed by the diagnosis logic 230 that has received the detected information DT. The detected information DT may include information indicating whether a leakage current flows and the monitoring result MR, for example.

The diagnosis logic 230 may determine whether the magnitude of the leakage current is equal to or greater than a first critical (or threshold) value based on the detected information DT. According to an example embodiment, the diagnosis logic 230 may compare a leakage voltage V_LKG based on the leakage current to a desired (or alternatively, pre-set) first critical (or threshold) voltage V1, thereby determining whether the leakage current is equal to or greater than the first critical (or threshold) value. The leakage voltage V_LKG may be derived by applying the leakage current to a resistive element (e.g., resistive element 104 in FIG. 3). The magnitude of the first critical voltage V1 may be, for example, the product of the first critical (or threshold) value and the resistance of the resistive element 104 (FIG. 3).

Referring to FIG. 4A, in the standby mode STBY_MODE, the leakage voltage V_LKG is smaller than the first critical (or threshold) voltage V1. In this case, the diagnosis logic 230 may determine that the magnitude of the leakage current flowing into the internal circuit 100 is smaller than the first critical (or threshold) value. Therefore, the diagnosis logic 230 may diagnose that no error has occurred in the internal circuit 100.

Referring to FIG. 4B, in the standby mode STBY_MODE, the leakage voltage V_LKG is larger than the first critical (or threshold) voltage V1. In this case, the diagnosis logic 230 may determine that the magnitude of the leakage current flowing into the internal circuit 100 is greater than the first critical (or threshold) value. Therefore, the diagnosis logic 230 may diagnose that an error has occurred in the internal circuit 100. According to an example embodiment, the diagnosis logic 230 may output an error warning signal WRN to an external device outside the memory device 20 when it is diagnosed that an error has occurred in the internal circuit 100.

A memory device according to the inventive concepts may be included in an IoT product (e.g., a wearable device). For example, the wearable device may include an eyeglass-type device, a wristwatch-type device, or a band-type device that is used wirelessly in conjunction with a smart phone, a tablet, or the like. Because the wearable device may be used in close contact with the human body, a memory device applied thereto is desired to have high stability in terms of a leakage current and a leakage voltage. Therefore, a memory device according to the inventive concepts may self-diagnose a leakage current and may output an error warning signal to an external device according to a result of self-diagnosis, thereby preventing or mitigating issues caused by a leakage current.

Figure 5:
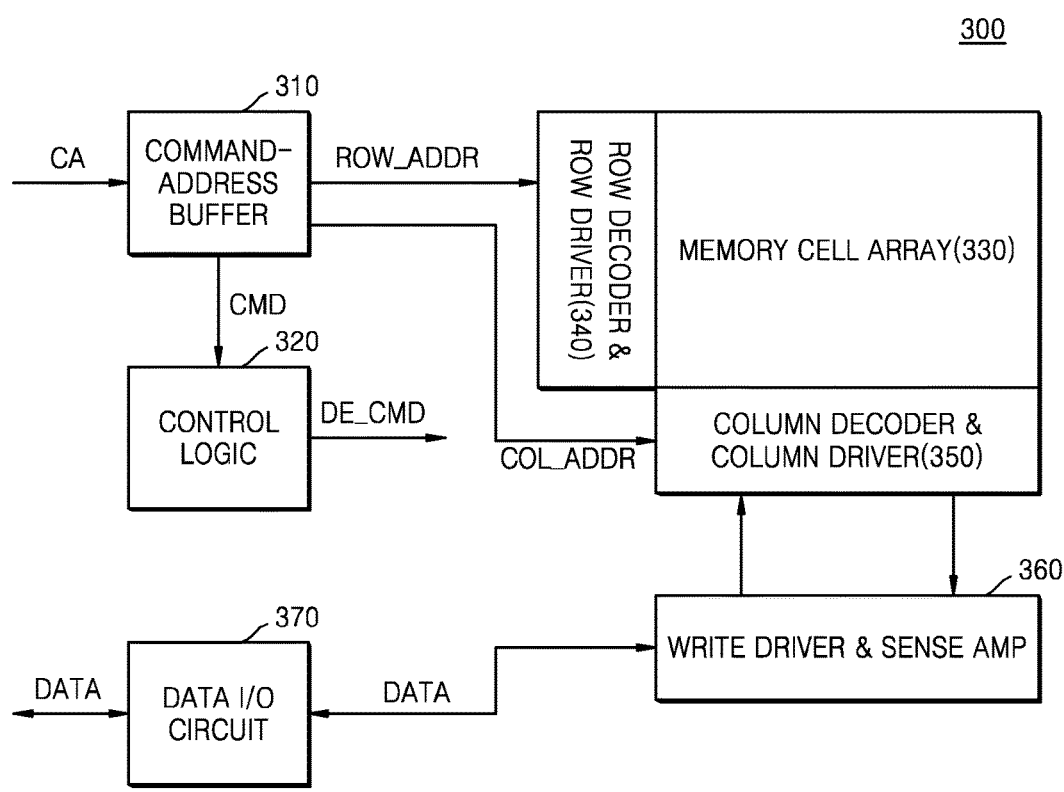
FIG. 5 is a block diagram showing a core/peripheral circuit according to an example embodiment.

FIG. 5 is a block diagram showing a core & peripheral circuit according to an example embodiment.

Referring to FIG. 5, the core/peripheral circuit 300 may include a command-address buffer 310, a control logic 320, a memory cell array 330, a row decoder &row driver 340, a column decoder & column driver 350, a write driver & sense amplifier 360, and a data I/O circuit 370.

The command-address buffer 310 receives a command-address CA from an external device outside the memory device 20 (FIG. 1), (e.g., the memory controller 10 (FIG. 1)), and may temporarily store the command-address CA. The term "command-address CA" may refer to characteristics in which either or both of command information and address information are supported or included in different manners. According to another example embodiment, the core/peripheral circuit 300 may separately include a command buffer and an address buffer instead of the command-address buffer 310, unlike in FIG. 5.

The command-address CA input to the command-address buffer 310 may include address information and/or a command CMD. The address information may be information regarding an address designating at least one of a plurality of memory cells of the memory cell array 330. The address information may include row-address information ROW_ADDR and column-address information COL_ADDR.

Although not specifically shown in FIG. 5, the command-address buffer 310 may include a latch capable of temporarily storing address information ADDR. Address information ADDR stored in the latch included in the command-address buffer 310 may be changed by the control logic 320 according to some example embodiments. The command-address buffer 310 may, under the control of the control logic 320, transmit the address information ADDR to the row decoder & row driver 340 or the column decoder & column driver 350.

A command CMD included in the command-address CA may be information for determining an operation of the core/peripheral circuit 300. According to some example embodiments, the command-address buffer 310 may include a latch capable of temporarily storing the command CMD. The command-address buffer 310 may transmit the command CMD to the control logic 320.

The control logic 320 may control overall operations of the core/peripheral circuit 300. For example, the control logic 320 may include a command decoder (not shown) and/or a clock generator (not shown). The command decoder (not shown) may internally generate a decoded command signal by decoding a command CMD received from the command-address buffer 310. Furthermore, the clock generator (not shown) may generate a clock signal and supply the clock signal to the core/peripheral circuit 300.

The memory cell array 330 may include word lines and bit lines, as well as memory cells that are connected to the word lines and the bit lines, respectively. The memory cells may store at least one bit of data. The memory cells may include volatile memories that are capable of storing data while power is being supplied thereto, however the memory cells are not limited thereto.

The row decoder & row driver 340 may perform an operation for selecting any one of the word lines and an operation for driving the selected word line using a desired driving voltage, based on row-address information ROW_ADDR output from the command-address buffer 310. The column decoder & column driver 350 may control a connection between each of the bit lines and the write driver & sense amplifier 360, based on column-address information COL_ADDR output from the command-address buffer 310.

For example, when address information stored in the command-address buffer 310 designates a memory cell corresponding to a first address, the row decoder & row driver 340 may select a word line to which a memory cell corresponding to the first address belongs from among the word lines, whereas the column decoder & column driver 350 may connect a bit line, to which the memory cell corresponding to the first address belongs, to the write driver & the sense amplifier 360.

Based on write data received from the data I/O circuit 370, the write driver & sense amplifier 360 may generate a current signal corresponding thereto. The write driver & sense amplifier 360 may sense and amplify a current signal output from at least one bit line connected to the column decoder & column driver 350, generate read data corresponding to the sensed and amplified current signal, and transmit the read data to the data I/O circuit 370.

The data I/O circuit 370 may include a data input circuit (not shown) and a data output circuit (not shown) connected to a data I/O terminal. The data input circuit (not shown) may receive write data input from the data I/O terminal and transmit the write data to a data write driver under the control of the control logic 320 during a data write operation. The data output circuit (not shown) may output read data transmitted from a sense amplifier to an external device through a data I/O terminal under the control of the control logic 320 during a data read operation.

Figure 6:
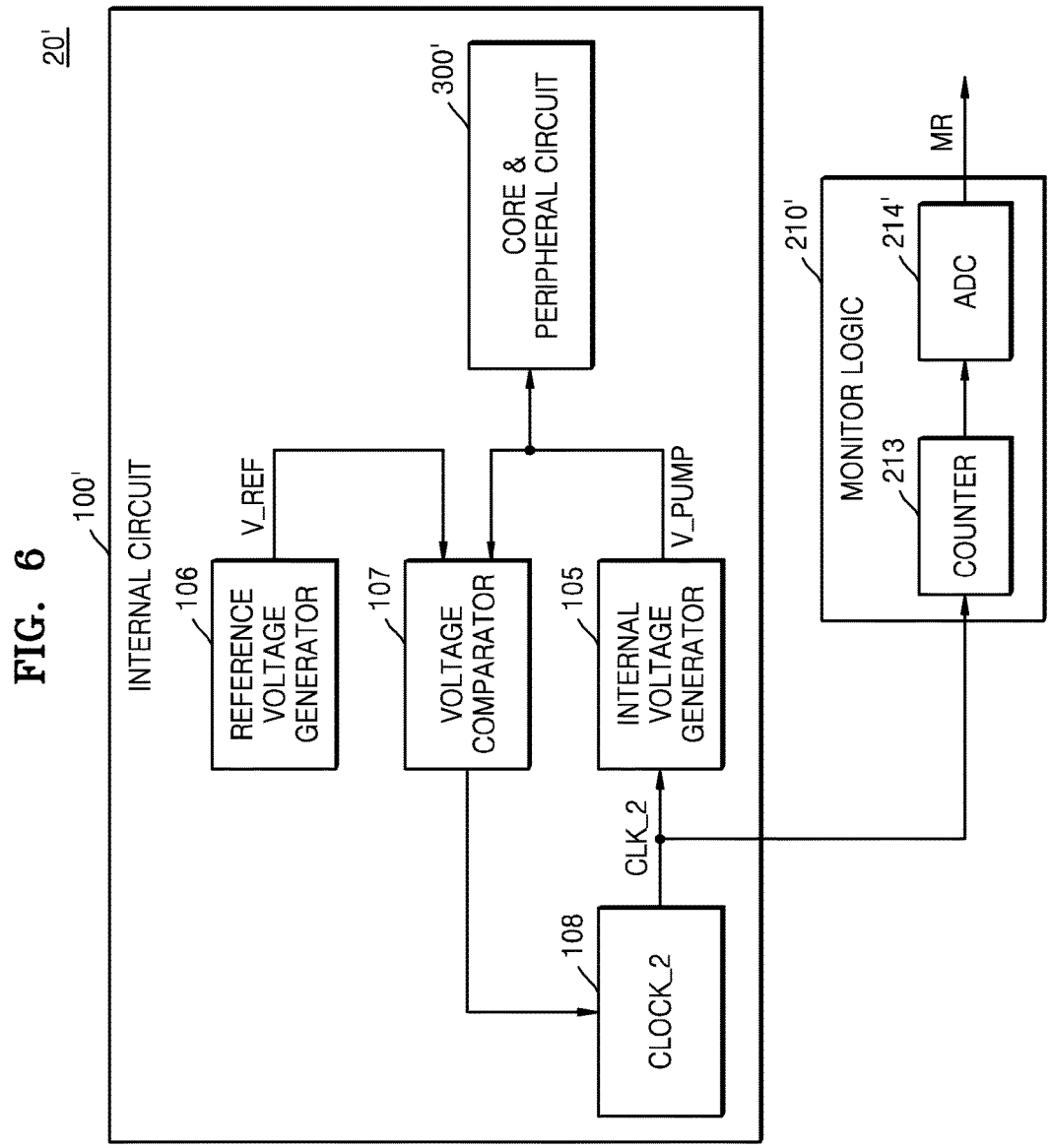
FIG. 6 is a block diagram of functional components of a monitor logic, according to an example embodiment.

FIG. 6 is a block diagram for describing functional components of a monitor logic, according to an example embodiment. Referring to FIG. 6, an internal circuit 100' includes an internal voltage generator 105, a reference voltage generator 106, a voltage comparator 107, a second clock generator 108, and a core/peripheral circuit 300'.

The internal voltage generator 105 may change and output an internal voltage V_PUMP for driving the core/peripheral circuit 300', based on a second clock signal CLK_2 output from the second clock generator 108. According to an example embodiment, the internal voltage generator 105 may be activated by the second clock signal CLK_2, perform a charge-pump operation with respect to the internal voltage V_PUMP, and output the changed internal voltage V_PUMP to the core/peripheral circuit 300'.

For example, when the internal voltage generator 105 is activated while the second clock signal CLK_2 is logic high, the internal voltage generator 105 may gradually increase and output the internal voltage V_PUMP while the logic high second clock signal CLK_2 is being input. In another example, when the internal voltage generator 105 is activated while the second clock signal CLK_2 is logic low, the internal voltage generator 105 may gradually increase and output the internal voltage V_PUMP while the logic low second clock signal CLK_2 is being input. According to an example embodiment, the internal voltage generator 105 may include a charge-pump circuit.

The reference voltage generator 106 may output a reference voltage V_REF to be compared to the internal voltage V_PUMP. The voltage comparator 107 may receive the reference voltage V_REF and the internal voltage V_PUMP and perform a comparing operation. The voltage comparator 107 may output a result of comparing the reference voltage V_REF to the internal voltage V_PUMP to the second clock generator 108.

The second clock generator 108 may output the second clock signal CLK_2 to the internal voltage generator 105, based on an output of the voltage comparator 107. For example, the second clock generator 108 may output the second clock signal CLK_2 based on a clock signal CLK input from the memory controller 10 (FIG. 1) and an output of the voltage comparator 107. In another example, the second clock generator 108 may output the second clock signal CLK_2 based on a clock signal internally generated by a memory device 20' and an output of the voltage comparator 107.

When the internal voltage V_PUMP is lower than the reference voltage V_REF according to a result of a comparison performed by the voltage comparator 107, the second clock generator 108 may output the second clock signal CLK_2 to activate the internal voltage generator 105. According to an example embodiment, when the internal voltage V_PUMP is higher than the reference voltage V_REF according to a result of a comparison performed by the voltage comparator 107, the second clock generator 108 may output the second clock signal CLK_2 to deactivate the internal voltage generator 105.

A monitor logic 210' may include a counter 213 and an analog-to-digital converter 214'. The counter 213 may receive the second clock signal CLK_2 and count a period of the second clock signal CLK_2. The counter 213 may output a result of counting the period of the second clock signal CLK_2 to the analog-to-digital converter 214'.

The analog-to-digital converter 214' may convert counting information output from the counter 213 into a digital code. According to an example embodiment, the analog-to-digital converter 214' may convert analog counting information output from the counter 213 into a digital code and output the digital code as a monitoring result MR.

Figure 7A:
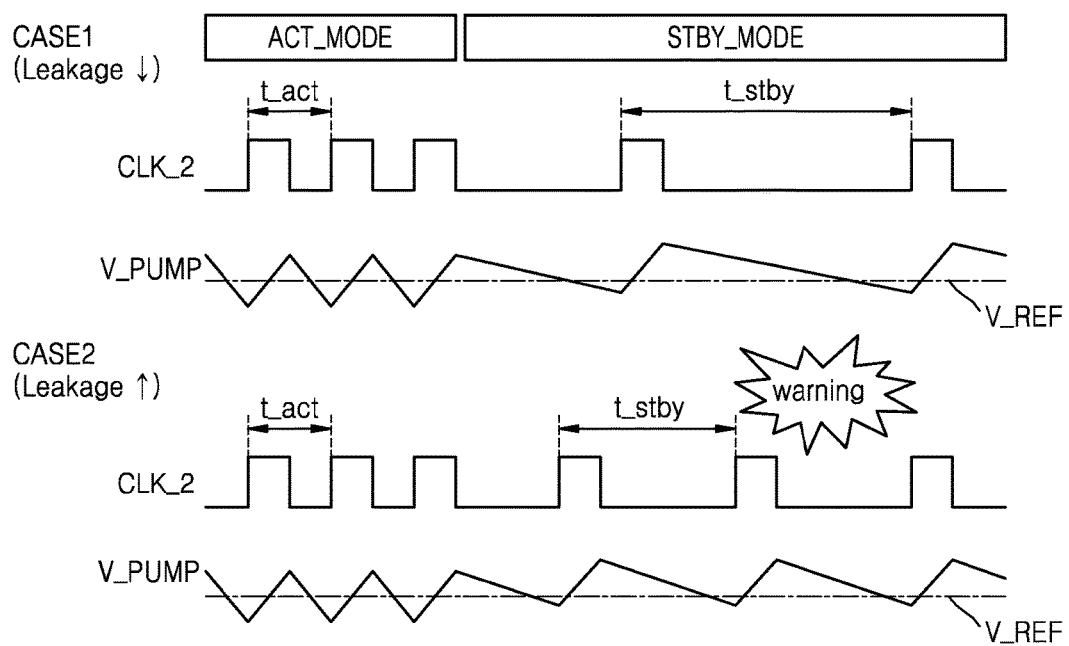
FIGS. 7A and 7B are graphs for describing an operation of a memory device, according to an example embodiment.
Figure 7B:
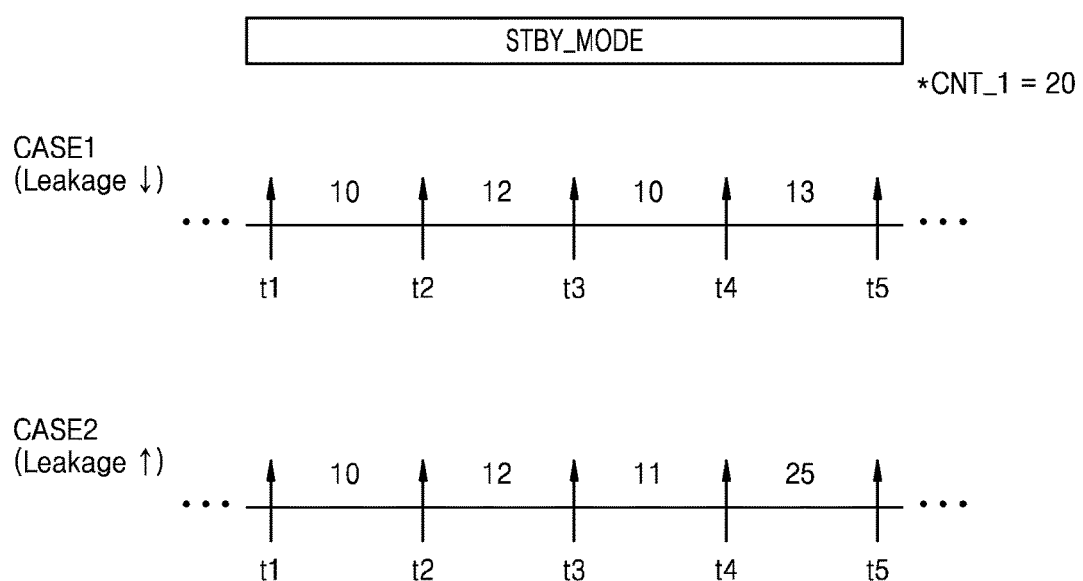

FIGS. 7A and 7B are graphs for describing an operation of a memory device, according to an example embodiment. FIGS. 7A and 7B may be graphs related to an operation of the memory device 20 shown in FIGS. 1, 2, and 6, for example.

Referring to FIG. 7A, a case where the level of a leakage current flowing into the internal circuit 100' is relatively low is shown as CASE 1, and a case where the level of the leakage current flowing into the internal circuit 100' is relatively high is shown as CASE 2. Although FIG. 7A shows that the second clock signal CLK_2 has a uniform period t_act in an active mode ACT_MODE, the inventive concepts are not limited thereto. Furthermore, although FIG. 7A shows that the period t_act of the second clock signal CLK_2 in the active mode ACT_MODE is shorter than the period t_stby of the second clock signal CLK_2 in the standby mode STBY_MODE, the inventive concepts are not limited thereto According to an example embodiment, a charge-pump operation may be performed when the second clock signal CLK_2 is logic high. According to another example embodiment, a charge-pump operation may also be performed when the second clock signal CLK_2 is logic low. When the internal voltage V_PUMP drops below the reference voltage V_REF due to, for example, a leakage current, the second clock generator 108 may output a logic high second clock signal CLK_2. The internal voltage generator 105 may perform a charge-pump operation based on the logic high second clock signal CLK_2.

In the standby mode STBY_MODE, the period t_stby of the second clock signal CLK_2 in the CASE 2 may be shorter than the period t_stby of the second clock signal CLK_2 in the CASE 1. In other words, the larger the leakage current flowing to the internal circuit 100' in the standby mode STBY_MODE, the more the charge-pump operation may be performed at the internal voltage generator 250.

In the standby mode STBY_MODE of the CASE 1, a leakage current exists but has a relatively small magnitude, and thus the diagnosis logic 230 may diagnose that no error has occurred in the internal circuit 100'. According to an example embodiment, the number of periods of the second clock signal CLK_2 counted by the counter 213 in the CASE 1 may be smaller than a first critical (or threshold) value.

In the standby mode STBY_MODE of the CASE 2, a leakage current exists and has a relatively large magnitude, and thus the diagnosis logic 230 may diagnose that an error has occurred in the internal circuit 100'. According to an example embodiment, the number of periods of the second clock signal CLK_2 counted by the counter 213 in the CASE 2 may be greater than the first critical (or threshold) value. In the CASE 2, the diagnosis logic 230 may output an error warning signal WRN to an external device outside the memory device 20'.

Referring to FIG. 7B, counted values for periods of the second clock signal CLK_2 for the respective cases of FIG. 7A in the standby mode STBY_MODE are shown. Although FIG. 7B shows that the standby mode STBY_MODE is divided by the first through fifth time points t1 through t5, the inventive concepts are not limited thereto. Furthermore, a counted value and a first critical (or threshold) value CNT_1 regarding the period of each time interval are shown as arbitrary numbers, merely for convenience of explanation, and are not limited thereto.

For example, the first critical (or threshold) value CNT_1 may be a counted value regarding a reference clock signal (e.g., the number of periods the reference clock signal) of the memory device 20'. In another example, the first critical (or threshold) value CNT_1 may be a pre-set value or a desired value.

In the CASE 1, counted values regarding the period of the second clock signal CLK_2 for the respective time intervals in the standby mode STBY_MODE may be 10 times between the first time point t1 and the second time point t2, 12 times between the second time point t2 and the third time point t3, 10 times between the third time point t3 and the fourth time point t4, and 13 times between the fourth time point t4 and the fifth time point t5. Therefore, in the standby mode STBY_MODE of the CASE 1, there is no time interval having a counted value greater than 20, which is the first critical (or threshold) value CNT_1, and thus the diagnosis logic 230 may determine that no error has occurred in the internal circuit 100'.

In the CASE 2, counted values regarding the period of the second clock signal CLK_2 for the respective time intervals in the standby mode STBY_MODE may be 10 times between the first time point t1 and the second time point t2, 12 times between the second time point t2 and the third time point t3, 11 times between the third time point t3 and the fourth time point t4, and 25 times between the fourth time point t4 and the fifth time point t5. Therefore, in the standby mode STBY_MODE of the CASE 2, the counted value between fourth time point t4 and the fifth time point t5 is greater than 20, which is the first critical (or threshold) value CNT_1, and thus the diagnosis logic 230 may diagnose that an error has occurred in the internal circuit 100'. According to an example embodiment, in this case, the diagnosis logic 230 may output an error warning signal WRN to an external device outside the memory device 20'.

Figure 8:
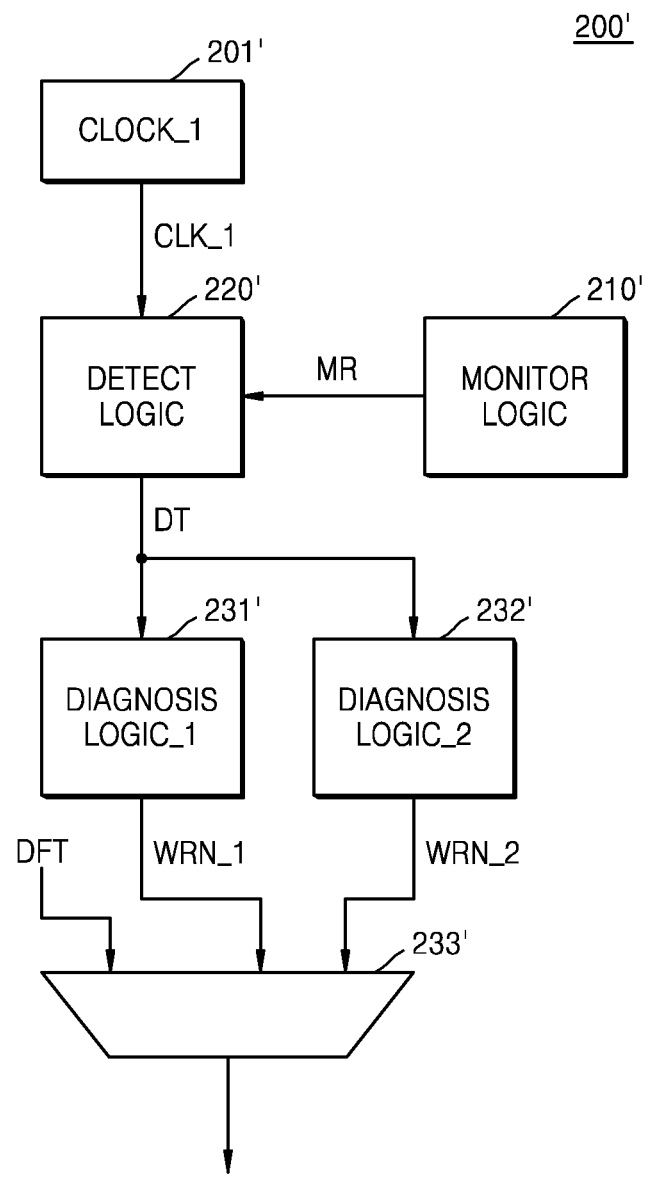
FIG. 8 is a block diagram of functional components of an error detect circuit, according to another example embodiment.

FIG. 8 is a block diagram of functional components of an error detect circuit, according to another example embodiment. With respect to FIG. 8, detailed descriptions of technical configurations identical to those of FIG. 2 are omitted.

Referring to FIG. 8, an error detect circuit 200' may include a first diagnosis logic 231', a second diagnosis logic 232', and a multiplexer 233'. The first and second diagnosis logics 231' and 232' may output a first error warning signal WRN_1 and a second error warning signal WRN_2, respectively, based on detected information DT. For example, the first diagnosis logic 231' may output the first error warning signal WRN_1 based on the detected information DT and a first critical (or threshold) value. Furthermore, the second diagnosis logic 232' may output the second error warning signal WRN_2 based on the detected information DT and a second critical (or threshold) value.

The multiplexer 233' may receive the first error warning signal WRN_1 from the first diagnosis logic 231' and the second error warning signal WRN_2 from the second diagnosis logic 232'. Furthermore, the multiplexer 233' may further receive a default signal DFT. The default signal DFT may be, for example, a signal for notifying that no error has occurred in the internal circuit 100 (FIG. 1). The multiplexer 233' may be controlled by, for example, the first diagnosis logic 231' and/or the second diagnosis logic 232', and selectively output one of the default signal DFT, the first error warning signal WRN_1, or the second error warning signal WRN_2.

According to an example embodiment, the first critical (or threshold) value on which the first diagnosis logic 231' is based may be a value smaller than the second critical (or threshold) value on which the second diagnosis logic 232' is based. For example, when the magnitude of a detected leakage current is smaller than the first critical (or threshold) value, the multiplexer 233' may be controlled so as to output the default signal DFT. When the magnitude of the detected leakage current is greater than the first critical (or threshold) value and smaller than the second critical (or threshold) value, the multiplexer 233' may be controlled so as to output the first error warning signal WRN_1. When the magnitude of the detected leakage current is greater than the second critical (or threshold) value, the multiplexer 233' may be controlled so as to output the second error warning signal WRN_2.

According to an example embodiment, an output of the multiplexer 233' may be applied to an external device outside the memory device 20 (FIG. 1). For example, when the output of the multiplexer 233' is applied to the memory controller 10 (FIG. 1), the default signal DFT, the first error warning signal WRN_1, and the second error warning signal WRN_2 may demand different responses from the memory controller 10 (FIG. 1). Although two diagnosis logics are illustrated and explained in the present example embodiment, the number of diagnosis logics is not limited thereto.

Figure 9:
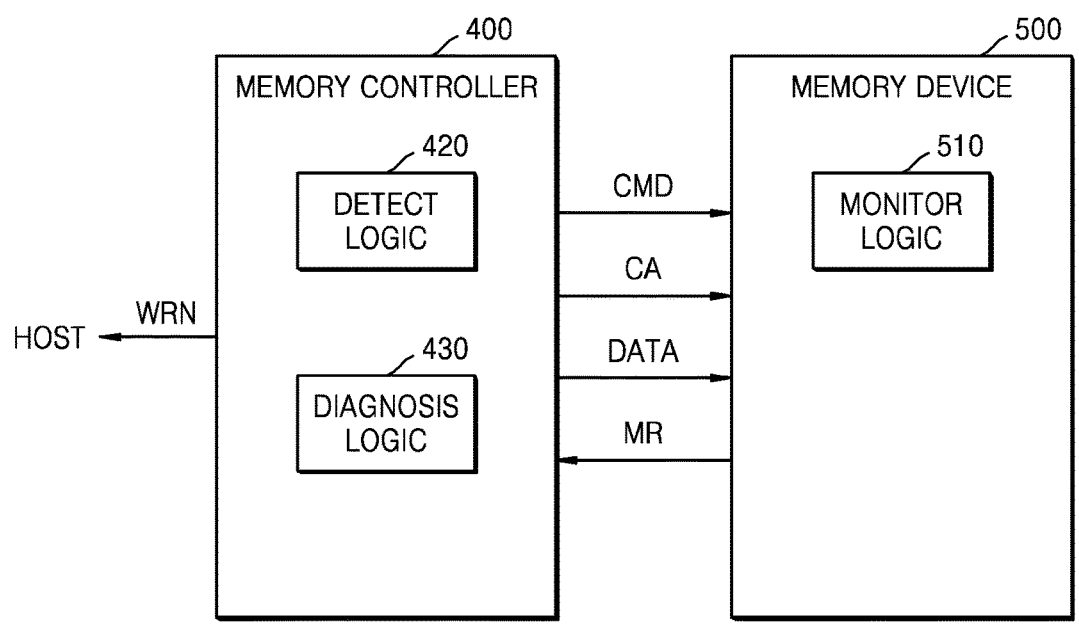
FIG. 9 is a diagram showing a memory system including a memory device, according to another example embodiment.

FIG. 9 is a block diagram showing a memory system including a memory device, according to another example embodiment.

Referring to FIG. 9, a memory system 2 may include a memory controller 400 and a memory device 500. The memory controller 400 may include a detect logic 420 and a diagnosis logic 430. Furthermore, the memory device 500 may include a monitor logic 510. Descriptions of the components shown in FIG. 9 which are identical to those of FIG. 1 are omitted.

The monitor logic 510 may monitor a current flowing into at least one internal circuit that drives a memory cell, and output a monitoring result MR to the memory controller 400. The monitor logic 510 may, for example, monitor a current flowing into the internal circuit in the standby mode.

The detect logic 420 may detect whether a leakage current flows in the internal circuit of the memory device 500 based on the monitoring result MR, and may output detected information regarding the leakage current. The diagnosis logic 430 may diagnose for an error in the internal circuit based on the detected information output from the detect logic 420. The diagnosis logic 430 may output an error warning signal WRN to a host when it is diagnosed that an error has occurred in the internal circuit of the memory device 500.

Figure 10:
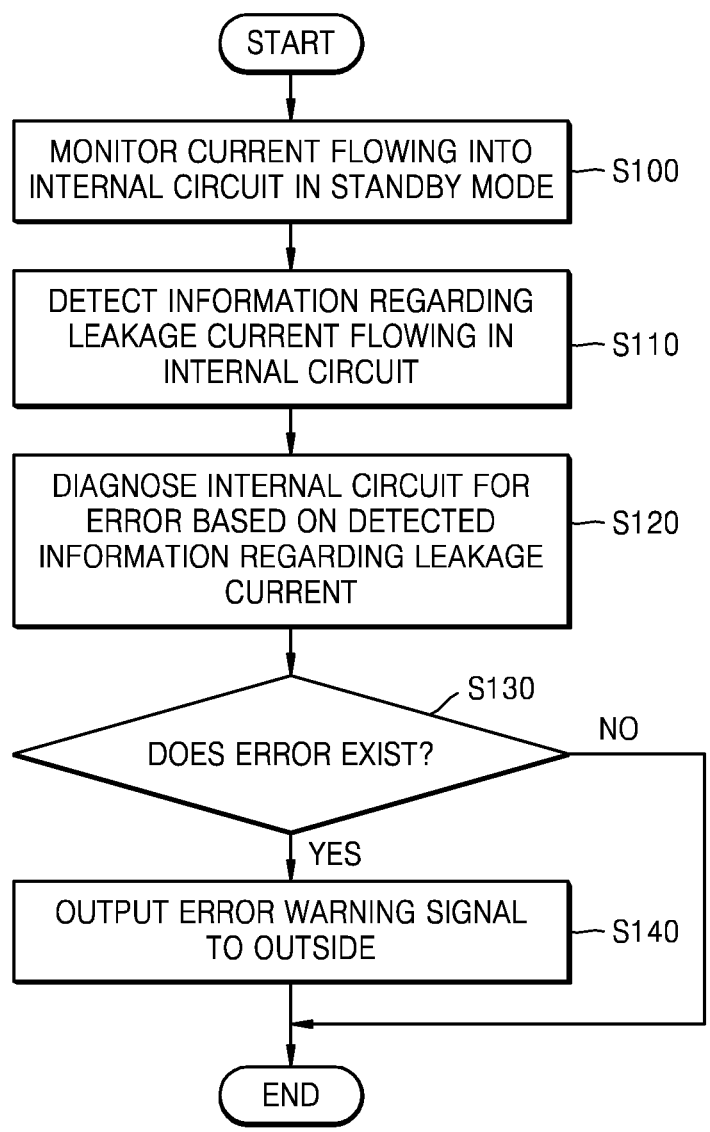
FIG. 10 is a flowchart for describing operations of a memory device, according to an example embodiment.

FIG. 10 is a flowchart for describing operations of a memory device, according to an example embodiment. FIG. 10 may be a flowchart regarding operations of the memory device shown in FIGS. 1 to 3, for example.

Referring to FIG. 10, in the standby mode, the memory device 20 may monitor a current flowing into the internal circuit 100 (operation S100). A current flowing into the internal circuit 100 may be monitored, for example, via the monitor logic 210. According to an example embodiment, the monitor logic 210 may monitor a current by sensing a voltage based on the current flowing into the internal circuit 100 in the standby mode.

Next, the memory device 20 may detect information regarding a leakage current flowing in the internal circuit 100 based on the monitoring information (operation S110). The information regarding the leakage current may be detected, for example, by the detect logic 220.

Next, the memory device 20 may diagnose the internal circuit 100 for an error based on the detected information regarding the leakage current information (operation S120). The diagnosis for an error of the internal circuit 100 may be performed, for example, by the diagnosis logic 230. Whether an error exists in the internal circuit 100 may be determined based on the detected information regarding the leakage current (operation S130). When there exists an error, the diagnosis logic 230 may output an error warning signal to an external device outside the memory device 20 (S140). According to an example embodiment, the error warning signal may be a request signal for a device outside the memory device 20.

Figure 11:
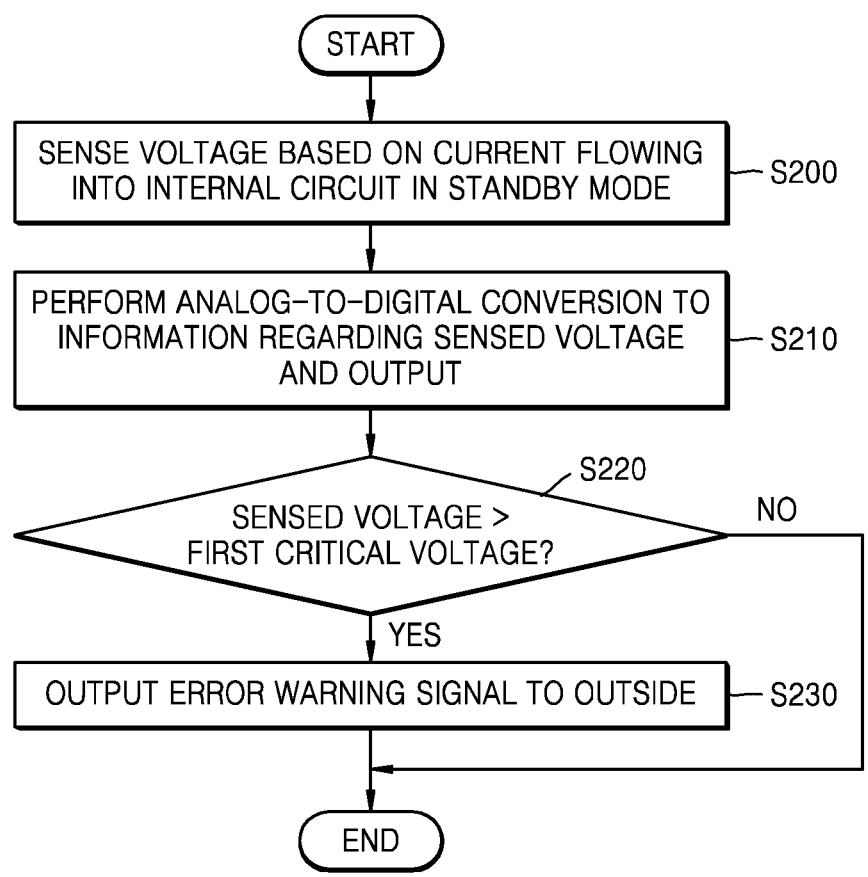
FIG. 11 is a flowchart for describing detailed operations of a memory device, according to an example embodiment.

FIG. 11 is a flowchart for describing detailed operations of a memory device, according to an example embodiment. FIG. 11 may be a flowchart of operations of the memory device shown in FIGS. 1 to 3, for example.

Referring to FIG. 11, in the standby mode, the memory device 20 may sense a voltage based on a current flowing into an internal circuit (operation S200). The voltage may be sensed, for example, by a voltage meter 212 included in the monitor logic 210. According to an example embodiment, the voltage meter 212 may be connected in parallel with the resistive element 104 to which the current flowing into the internal circuit is applied, and may sense a voltage.

Next, information regarding the sensed voltage may be analog-to-digital converted and output (operation S210). The analog-to-digital conversion may be performed, for example, by the analog-to-digital converter 214 included in the monitor logic 210. In other words, the analog-to-digital converter 214 may convert the sensed voltage into a digital code and output the digital code.

Next, whether the sensed voltage is higher than a first critical (or threshold) voltage may be determined (operation S220). When the sensed voltage is higher than the first critical (or threshold) voltage, the memory device 20 may output an error warning signal to an external device (operation S230).

Figure 12:
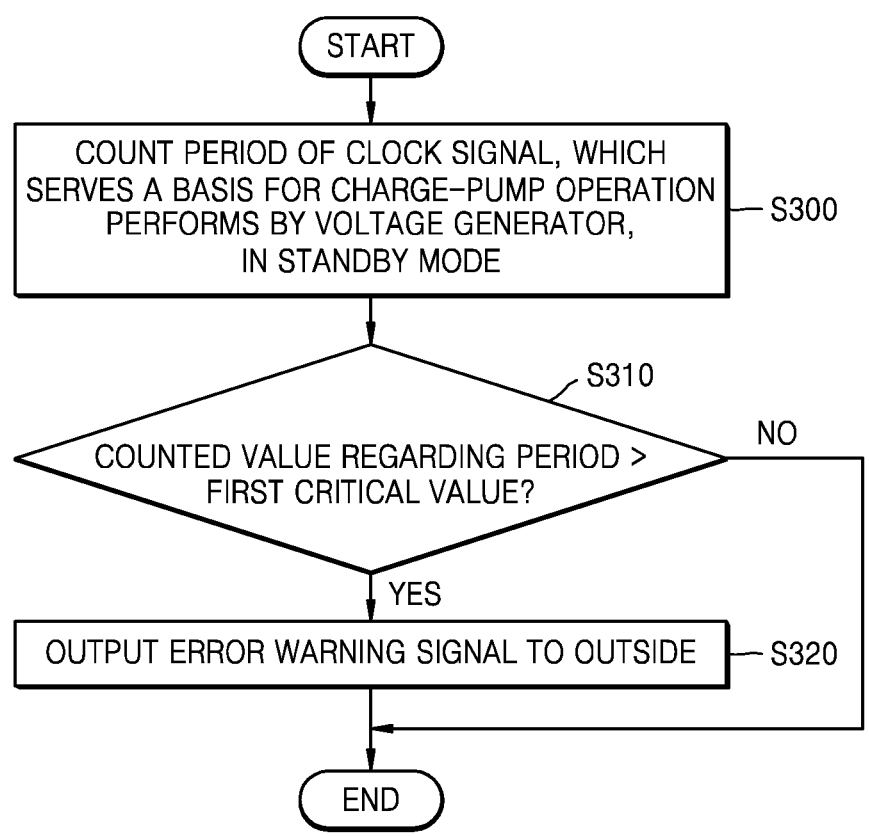
FIG. 12 is a flowchart for describing detailed operations of a memory device, according to an example embodiment.

FIG. 12 is a flowchart for describing detailed operations of a memory device, according to an example embodiment. FIG. 12 may be a flowchart of operations of the memory device shown in FIGS. 1, 2, and 6, for example.

Referring to FIG. 12, in the standby mode, the memory device 20' may count the period of the clock signal CLK_2, which serves as a basis for charge-pump operation performs by the internal voltage generator 105 (operation S300). The number of periods of the clock signal CLK_2 may be counted, for example, by the counter 213 included in the monitor logic 210'. According to an example embodiment, a counted value regarding the periods may be converted to a digital code and output by the analog-to-digital converter 214'.

Next, whether the counted value regarding the periods is greater than a first critical (or threshold) value may be determined (operation S310). When the counted value regarding the periods is greater than the first critical value, the memory device 20' may output an error warning signal WRN to an external device (operation S320).

Figure 13:
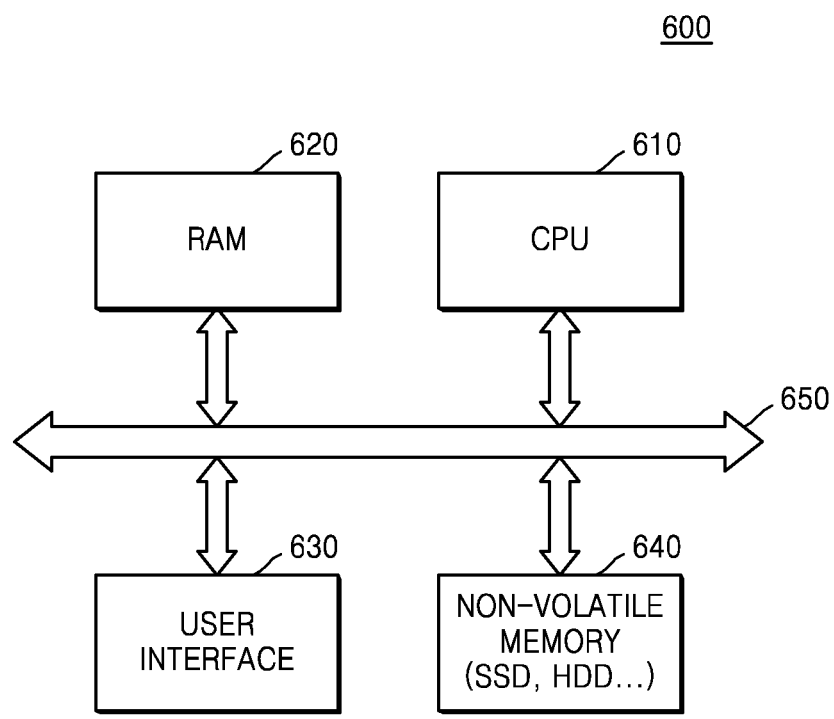
FIG. 13 is a block diagram showing a computing system with a memory system, according to an example embodiment.

FIG. 13 is a block diagram showing a computing system with a memory system, according to an example embodiment. A memory device according to the inventive concepts may be mounted in a computing system 600 (e.g., a mobile device or a desktop computer) as a RAM 620. The memory device mounted as the RAM 620 may be any device of the example embodiments described above.

The computing system 600 according to an example embodiment may include a central processing unit (CPU) 610, the RAM 620, a user interface 630, and a non-volatile memory 640, wherein the components may be electrically connected to a bus 650. The CPU 610 may be, for example, an AP. The non-volatile memory 640 may be a large storage device, such as an SSD or an HDD.

As the memory device according to an example embodiment is applied to the computing system 600, the memory device may self-determine whether an error occurs by monitoring a leakage current flowing to the internal circuit of the memory device in the standby mode. Therefore, the computing system 600 may secure a high level of stability and may be applied to fields including IoT.

While the inventive concepts have been particularly shown and described with reference to some example embodiments thereof, it will be understood that various changes in form and details may be made therein without departing from the spirit and scope of the following claims.

What is claimed is:

1. A memory device comprising:
at least one internal circuit including core/peripheral circuitry having a memory cell array and a peripheral circuit configured to drive the memory cell array;
a monitor logic configured to monitor a current flowing into the at least one internal circuit in a standby mode, and output a monitoring result, the standby mode being a mode in which a plurality of first switches between a power supply and the core/peripheral circuitry are turned off;
a detect logic configured to detect whether a leakage current flows in the at least one internal circuit based on the monitoring result, and output detected information regarding the leakage current; and
a diagnosis logic configured to diagnose an error in the at least one internal circuit based on the detected information.

2. The memory device of claim 1, wherein the monitor logic is configured to monitor a current flowing into the at least one internal circuit in the standby mode.

3. The memory device of claim 1, wherein the diagnosis logic is configured to output an error warning signal to an external device outside the memory device when it is determined that an error has occurred in the at least one internal circuit.

4. The memory device of claim 1, wherein the monitor logic comprises:
a voltage meter configured to sense a voltage based on the current flowing into the at least one internal circuit; and
an analog-to-digital converter configured to perform an analog-to-digital conversion with respect to the voltage sensed by the voltage meter.

5. The memory device of claim 1, wherein the diagnosis logic is configured to diagnose that the error has occurred when a magnitude of the leakage current detected by the detect logic is greater than a threshold value.

6. The memory device of claim 1, further comprising:
an internal clock generator configured to output an internal clock signal; and
a voltage generator configured to change and output a voltage for driving the at least one internal circuit, based on the internal clock signal,
wherein the monitor logic includes a counter configured to count a number of periods of the internal clock signal.

7. The memory device of claim 6, wherein the diagnosis logic is configured to diagnose that the error has occurred when the number of periods of the internal clock signal counted by the counter is greater than a threshold value.

8. The memory device of claim 7, wherein the threshold value is a number of periods of a reference clock signal of the memory device counted by the counter.

9. The memory device of claim 6, wherein the voltage generator is configured to perform a charge-pump operation with respect to the voltage for driving the at least one the internal circuit based on the internal clock signal.

10. A memory device comprising:
a power supply;
at least one internal circuit configured to receive a voltage from the power supply, the at least one internal circuit including core/peripheral circuitry having a memory cell array and a peripheral circuit configured to drive the memory cell array; and
an error detect circuit configured to detect a leakage current flowing into the core/peripheral circuitry in a standby mode, and detect an error regarding the at least one internal circuit based on information regarding the leakage current, the standby mode being a mode in which a plurality of first switches between the power supply and the core/peripheral circuitry are turned off.

11. The memory device of claim 10, wherein the error detect circuit comprises:
a monitor logic configured to monitor a current flowing between the power supply and the core/peripheral circuitry in the standby mode and output a monitoring result;
a detect logic configured to detect whether the leakage current flows in the core/peripheral circuitry based on the monitoring result and output the information regarding the leakage current; and
a diagnosis logic configured to diagnose the error in the core/peripheral circuitry, based on the information regarding the leakage current, and output an error warning signal to an external device outside the memory device when it is diagnosed that the error has occurred in the at least one internal circuit.

12. The memory device of claim 11, further comprising:
a second switch including a first end connected to the power supply and a second end connected to a resistive element and configured to form a current path flowing between the power supply and the core/peripheral circuitry; and
the resistive element including a first end connected to the second switch and a second end connected to the core/peripheral circuitry,
wherein the monitor logic is connected to the resistive element in parallel.

13. The memory device of claim 12, wherein the second switch is configured to be turned on in the standby mode.

14. The memory device of claim 12, wherein the monitor logic comprises a voltage meter configured to measure voltages at both ends of the resistive element.

15. The memory device of claim 14, wherein the monitor logic further comprises an analog-to-digital converter configured to convert the voltages measured by the voltage meter into a digital code and output the digital code.

16. The memory device of claim 11, further comprising:
an internal clock generator configured to output an internal clock signal;
a reference voltage generator configured to output a reference voltage;
an internal voltage generator configured to change and output a voltage for driving the core/peripheral circuitry based on the internal clock signal; and
a comparator configured to compare the reference voltage to the voltage for driving the core/peripheral circuitry and output a result of the comparing,
wherein the internal clock generator is configured to change and output a period of the internal clock signal based on the result of the comparing, and
the monitor logic includes a counter configured to count a number of periods of the internal clock signal.

17. The memory device of claim 16, wherein the diagnosis logic is configured to diagnose that the error has occurred when a counted value regarding the number of periods of the internal clock signal is greater than a threshold value.

18. A method of operating a memory device, the method comprising:
entering into a standby mode by turning off a plurality of first switches between a power supply and a core/peripheral circuitry, the core/peripheral circuitry including a memory cell array and a peripheral circuit configured to drive the memory cell array;
monitoring a current flowing into core/peripheral circuit in the standby mode, and outputting a monitoring result;
detecting information regarding a leakage current flowing in the core/peripheral circuit based on the monitoring result;
diagnosing whether an error has occurred in the core/peripheral circuit based on the information regarding the leakage current; and
in response to a result of the diagnosing indicating that an error has occurred in the core/peripheral circuit, outputting an error warning signal to an external device outside the memory device.

19. The method of claim 18, wherein the monitoring comprises:
sensing a voltage based on the current flowing into the core/peripheral circuit in the standby mode; and
converting information regarding the voltage into a digital code and outputting the digital code as the monitoring result.

20. The method of claim 18, wherein the result of the diagnosing indicates that the error has occurred in response to a magnitude of the leakage current being greater than a threshold value.

* * * * *